INVENTOR
JOHN O. KESSLER
BY
W.S. Hill
AGENT

INVENTOR.
JOHN O. KESSLER
BY
W. S. Hill
AGENT

United States Patent Office 3,264,532
Patented August 2, 1966

3,264,532
HEAT RESPONSIVE VARIABLE CHARACTERISTIC SEMICONDUCTOR DEVICE

John O. Kessler, Princeton, N.J., assignor to Radio Corporation of America, a corporation of Delaware Filed Nov. 28, 1962, Ser. No. 240,600
9 Claims. (Cl. 317—234)

This invention relates to an adaptive semiconductor device and to methods of making the device.

Conventional semiconductor devices are circuit elements which are reasonably constant in their structure and characteristics toward changes in ambient conditions and toward electrical signals applied to or passing through them in the course of their intended use. Adaptive semiconductor devices are circuit elements whose structure and characteristics undergo controlled changes in response to particular ambient conditions and/or electrical signals applied to or passing through them, and remain reasonably constant with respect to other influences.

The device of the invention, described in a general way, comprises a body of semiconductor material including an N-type region, a P-type region, and a junction region separating the N-type and P-type regions. One or both of the N-type and P-type regions contain inclusions, as separate phases, of the elemental form of a relative mobile conductivity-type-determining impurity. The junction region includes nucleation centers for producing, as by precipitation, the inclusions in the junction regions.

A preferred embodiment comprises a germanium body having a P-type region doped predominantly with a relatively immobile P-type impurity for germanium, and an N-type region doped predominantly with lithium, which is a relatively mobile N-type impurity for germanium. There are inclusions of elemental lithium distributed in the N-type region, especially adjacent the junction region. This device exhibits the ordinary I-V (current-voltage) characteristic of a rectifier; that is, it passes a high current when biased in the forward direction, and passes a low current when biased in the backward direction. Unlike previous rectifiers, the I-V characteristic can be controllably and reversibly modified; that is, it can be adapted.

The adaption can be achieved by heating the device to between 100 and 300° C. and simultaneously applying a voltage to the device in the backward direction of current flow. The heat, which may be applied from an external source, or may be generated internally, increases the mobility of the relatively mobile impurity. The voltage produces an electric field in the body which causes the inclusions to migrate into the junction, producing leakage paths through the junction, and thereby reduces the ratio of forward current to back current. The adaption process may be stopped at any point in time and, upon cooling to room temperature, the device will retain its now adapted characteristics. The device may be readapted by again heating and applying a voltage so as to cause the inclusions to migrate. The adaption process may be reversed to return to the initial I-V characteristic by heating the device as described and applying a voltage in the forward direction of current flow in the device. Such direction of current flow causes the inclusions to migrate out of the junction and thereby increases the ratio of forward current to back current.

A more detailed description of the invention and illustrative embodiments thereof appear below in conjunction with the drawings in which:

FIGURE 1 includes also a circuit for adapting the device and a circuit for using the device.

Figure 3:
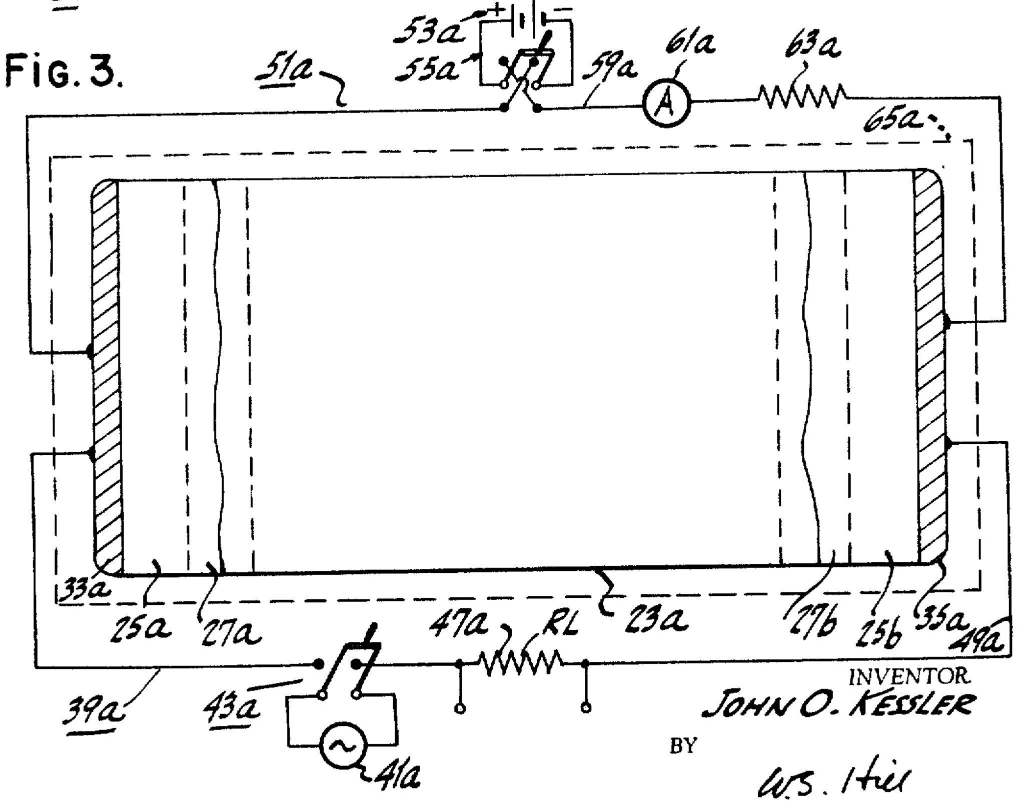

FIGURE 3 includes a sectional view of a second embodiment of the invention having two junctions.

Figure 4:
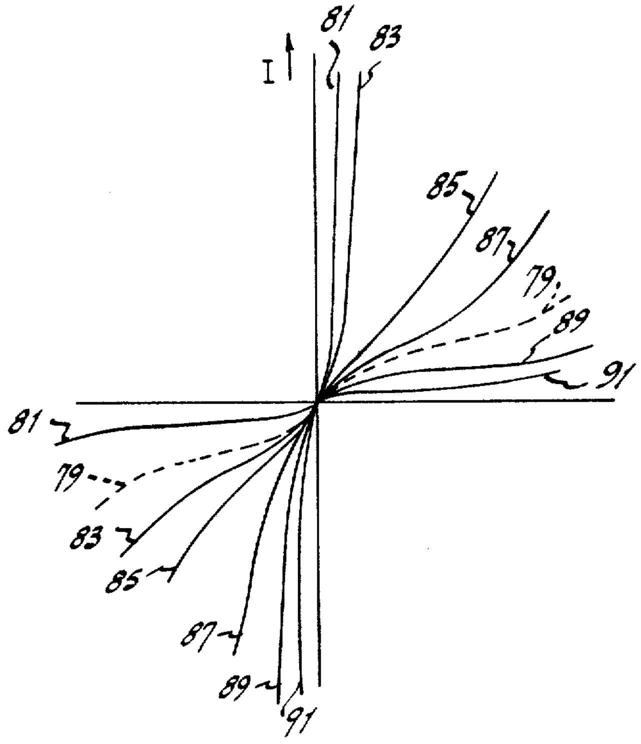

FIGURE 4 is a family of curves illustrating the I-V characteristic of the device of FIGURE 3 in various conditions of adaption and in the virgin condition.

Similar reference numerals are used for similar elements throughout the drawing.

Figure 1:
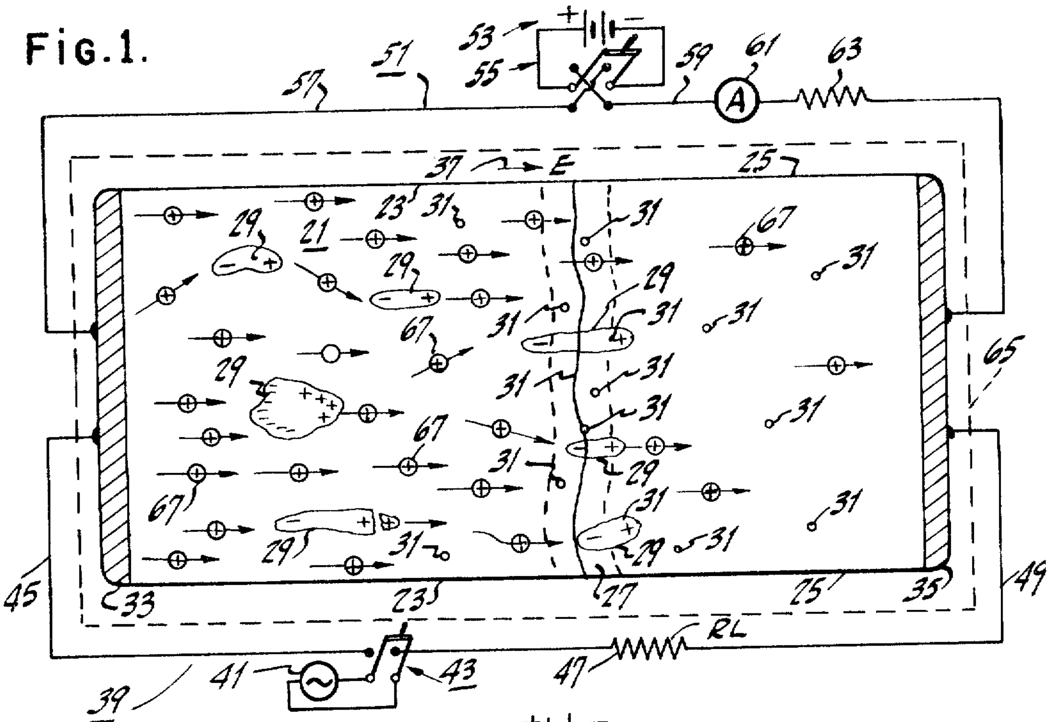
FIGURE 1 is a sectional view of a first embodiment of a device of the invention having a single junction.

FIGURE 1 illustrates a first embodiment of a device 21 of the invention having a single junction region. The device 21 comprises a semiconductor body having a first region 23 of one conductivity type and a second region 25 of the opposite conductivity type. A junction region 27 separates the first region 23 from the second region 25. There are inclusions 29, as separate phases, in the first region 23; and there are nucleation centers 31 for producing such inclusions in the junction region 27 under conditions which are described below. The inclusions are composed of the elemental form of a relatively mobile impurity which produces the one conductivity type in the particular semiconductor comprising the body. By inclusions is meant a mass of material, as separate phases from, though completely surrounded by, the semiconductor. The inclusions may, for example, be material that precipitates upon cooling a semiconductor which is saturated with the impurity. In the ordinary doped semiconductor, the impurity does not saturate the semiconductor and is not present as a separate phase from the semiconductor. There are some nucleation centers 31 of the type described also in the first region 23 and in the second region 25. The device is completed by a first and a second electrode 33 and 35 attached to the first region 23 and the second region 25 respectively.

The semiconductor body may be of any semiconductor material such as silicon, gallium arsenide, indium antimonide or cadmium sulfide; but it is preferably of germanium. The body is preferably a single crystal, but may be polycrystalline; and may be in any geometrical shape, such as a massive body or a thin film. The first region 23 may be either of N-type or P-type conductivity, and the inclusions 29 therein are of an element which produces the same conductivity type in the semiconductor material.

For illustrative purposes, the device 21 of FIGURE 1 is, hereafter considered, comprised of a single crystal body of germanium. The first region 23 is N-type germanium, and the inclusions 29 are elemental lithium, which is both N-type in germanium and relatively mobile at temperatures just above room temperature. The second region 25 is P-type germanium and is also part of the same single crystal. The ohmic electrodes 33 and 35 may be of any material used for this purpose in the art.

Figure 2:
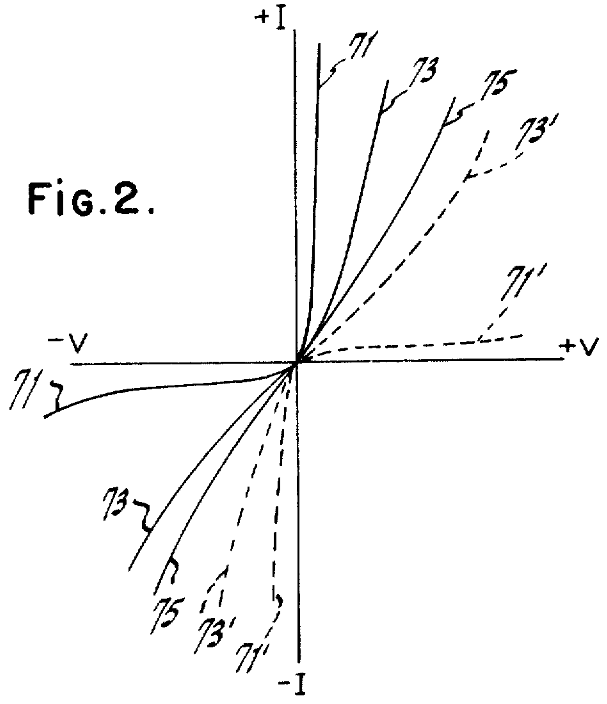
FIGURE 2 is a family of curves illustrating the I-V characteristic of the device of FIGURE 1 in various conditions of adaption.

FIGURE 1 shows also a utilization circuit 39. The utilization circuit shown is for rectifying alternating current (A.C.) from an A.C. source 41. The A.C. source 41 is connected through a double pole, single throw switch 43 to the first ohmic electrode 33 by a lead 45; and to the second ohmic electrode 35 through a load 47 by a lead 49. The load 47 may for example be a direct current motor, the speed of which is controlled by changing the characteristics of the device 21 so that it passes more or less direct current. With the switch 43 closed, the device 21 rectifies the A.C. from the A.C. source 41 in the usual way. The I-V (current-voltage) characteristic of the device 21 in this condition is a rectifying or unidirectional conductivity characteristic as shown by the curve 71 of FIGURE 2.

The I-V characteristic may be adapted by means of the adaption circuit 51 shown in FIGURE 1. The adaption circuit 51 comprises a direct current (D.C.) source 53, such as a battery, connected to a double-pole, double-throw reversing switch 55. A lead 57 connects one pole of the switch 55 to the first ohmic electrode 33. Another lead 59 connects the other pole of the switch 55 to the other second ohmic electrode 35 through an ammeter 61 and a current limiting resistor 63. The device 21 is contained in a temperature controlled ambient 65, which is shown schematically by a dotted rectangle in FIGURE 1. The controlled ambient 65 may be a liquid or powder in a container in which the device 21 is immersed, or it may be a gas in a chamber circulated about the device 21 or it may be simply thermal insulation about the device 21 for reducing the heat loss from internally generated heat, or it may be a thermal conductor for increasing the heat loss from the device. In any case, the controlled ambient 65 provides and/or maintains the device 21 at the temperature desired for adaption. For illustrative purposes, the means 65 are a container holding a silicone oil at the desired temperature.

Whenever adaption is desired in the particular example of FIGURE 1, the switch 43 is opened. Then the device is brought to the adaption temperature and the switch 55 is closed so as to provide a D.C. bias voltage to the device 21 in one or the other direction of current flow, e.g., the backward direction. As viewed in FIGURE 1, the switch 55 is closed downward so that the first ohmic electrode 33 is positive and the second ohmic electrode 35 is negative. The temperature of the device 21 is maintained between 50° C and 150° C. in our example. Other temperature ranges may apply where other semi-conductors are used as the body and other materials are used for the inclusions 29. After a short period of time, the switch 55 is opened and the device 21 is cooled. On examination, the device 21 exhibits a resistive or bidirectional I-V characteristic as shown by the curve 73. If the time period were longer or if the applied voltage higher, the device would have a resistive I-V characteristic as shown by the curve 75. Optionally, the device 21 adapted to have the characteristic illustrated in the curve 73 may be further adapted in a separate adaption step to reach the condition of the curve 75. The device 21 may thus be changed in I-V characteristic from the rectifying characteristic of curve 71 to the resistive characteristic of curve 75 or to any intermediate resistive characteristic by a proper selection of conditions, such as applied voltage, ambient temperature, and adaption time.

This adaption is reversible; that is, the I-V characteristic may be changed back to some previous I-V characteristic. This reversal may be achieved in the same manner as just described, except that the double-throw switch 55 is reversed, so that the first ohmic contact 33 is negative and the second ohmic contact 35 is positive. Thus, the characteristics of the device 21 may be electronically changed from any characteristic between curves 71 and 75 to any other characteristic in this range. Furthermore, the I-V characteristics of the device may be changed as many times as desired. The dotted curves 71' and 73' show the position of the I-V curves 71 and 73 when the ohmic contacts 33 and 35 are reversed in the utilization circuit 39.

The changes in the structure of the device 21 during adaption may be explained by reference to FIGURE 1 and the following theory. The N-type region 23 contains lithium ions 67, lithium metal precipitates 29, and nucleation centers 31 for precipitating lithium. When the device 21 is heated to between 50 and 150° C., the mobility of the lithium ions 67 increases significantly. When a voltage is applied in the back direction of current flow, a field E shown by the arrow 37 is produced across the device 21. The field E acts on the mobile lithium ions 67 in the first region 23 causing them to drift toward and into the junction region 27. The positive charges on lithium ions 67 which collide with lithium metal inclusions 29, are neutralized and lithium deposits in the elemental form. Lithium metal atoms at the opposite end of the inclusion 29 become positively charged and leave the inclusion 29. Thus the effect of the field E is to build up the inclusion on one side and to dissolve the inclusion on the opposite side. The inclusions build up in a needle-shape by virtue of the electric field E present in the body, and boundary conditions at the inclusion-semiconductor interface. By these processes, needle-shaped inclusions build up in the direction opposite to that of the field E. The buildup can take place either toward or away from the junction region 27, and is determined by the direction of the field E. New inclusions of elemental lithium are also produced by starting at nucleation centers 31 by a proper coincidence of conditions.

The building up or dissolving of needle-shaped inclusions 29 in the junction region 27 changes the I-V characteristics of the device 21. When the inclusions build up in the junction region 27, they provide current paths which bridge the junction region 27, thereby reducing the ratio of forward to back current. This shifts the I-V characteristic toward curve 75 of FIGURE 2. On the other hand, when inclusions dissolve out of the junction region 27, the ratio of forward to back current is increased, shifting the I-V characteristic toward the curve 71 of FIGURE 2. Whatever the correct theoretical explanation, the operation of the device is as described.

FIGURE 3 illustrates a second embodiment of the invention. The embodiment is similar to that of FIGURE 1 except that there are two junction regions **27*a* and 27*b*, and three conductivity regions 25*a*, 23*a* and 25*b* as viewed from left to right in FIGURE 3. The conductivity regions alternate in type, either P-N-P or N-P-N. For illustrative purposes, the device 21*a* is considered to be P-N-P, made of germanium, wherein the N region contains lithium ions and inclusions of elemental lithium. The first and second electrodes 33*a* and 35*a* contact the end P-type regions 25*a* and 25*b* respectively. The utilization circuit 39*a* and the adaption circuit 51** are the same in structure and operation as those illustrated in FIGURE 1.

FIGURE 4 illustrates a typical family of I-V curves obtained with the device **21*a* of FIGURE 3. In the condition described in the foregoing paragraph, the device 21*a* is essentially two rectifiers connected back to back. In one state, the device exhibits the approximately ohmic characteristic shown by the curve 85. As the device 21*a* is adapted in one direction of applied field E, the I-V characteristic shifts progressively toward the curve 81, in which condition one junction region is completely cleared of inclusions, while the other is shorted out by the inclusions. On applying a field E in the opposite direction during adaption, the I-V characteristic shifts toward the curve 93, in which condition the other junction is now cleared of inclusions and the first junction is shorted out by inclusions. The adaption may be repeated and reversed as many times as desired and one may adapt the device to any condition between and including the curves 81 and 93**.

The devices of the invention may include three or more junctions according to the principles set forth above with respect to one and two junction devices. The multiple junction devices may have two or more junctions in parallel with one another, which may also be in series with one or more other junctions. The junctions may be positioned with respect to one another so as to interact, for example, to provide transistor-like action.

The devices 21 and **21*a*** may be fabricated by any of the processes used for producing junction devices. In this process, one of the conductivity type regions is deliberately fabricated to contain inclusions of the elemental form of a relatively-mobile conductivity-type-determining impurity. This is achieved generally by dissolving the impurity in high enough concentration and at high enough temperatures such that the elemental form of the impurity precipitates upon cooling. There are phase diagrams for many systems which describe the concentrations and temperature differences which produce the desired precipitation.

Also, in this process, the one conductivity-type region is deliberately fabricated to contain nucleation centers for precipitating the desired inclusions. While some nucleation centers are normally formed by the previous fabrication processes, the more desirable steps for producing inclusions produce a more desirable density and distribution of nucleation centers for the purposes of adaption.

In the processes of making the devices, a step of annealing or forming may be employed, which has the effect of establishing the device characteristics, usually by producing at least one junction adjacent the region having inclusions therein.

There now follow several examples of particular procedures for making particular devices of the invention.

*Example 1.*—Start with a P-type rectangular single crystal wafer of germanium having a resistivity between 0.1 ohm-cm. and 5 ohm-cm. at room temperature. The wafer is about 0.5 x 0.5 x 0.01 cm. in size. Place the wafer in a dry mixture consisting essentially of equal parts of lithium chloride and lithium hydroxide in a quartz crucible. Heat the crucible and mixture at about 615° C. in flowing hydrogen for about 5 minutes. This heating melts the dry mixture and lithium ions diffuse into the germanium. The mass is then cooled to room temperature. In cooling, the damage resulting from the difference in coefficients of expansion between the wafer and the fused material acts as a source of nucleation centers. The wafer is removed from the solidified melt and is now lightly etched in dilute acid to remove the surface layer of disturbed material. Next, the wafers, which are now N-type, are annealed in flowing hydrogen gas at about 200° C. to 300° C. for about an hour to produce a thin P-type skin on the N-type wafer. The wafers are again lightly etched and ohmic contacts in the form of solder dots are applied to opposite surfaces of the wafer. The wafers are again etched to complete the device.

*Example 2.*—Follow the procedure of Example 1 except substitute helium for hydrogen in the heating and annealing steps.

*Example 3.*—Start with a P-type rectangular single crystal wafer of germanium, having a resistivity between 0.1 ohm-cm. and 5 ohm-cm. at room temperature. The wafer is about 0.5 x 0.5 x 0.01 cm. in size. Place the wafer in a dry mixture consisting essentially of equal parts of lithium chloride and lithium hydroxide in a quartz crucible. Heat the crucible and mixture at about 615° C. in flowing hydrogen for about 5 minutes. This heating melts the dry mixture and lithium ions diffuse into the germanium. The mass is then cooled to 200° C. and maintained in the same ambient at that temperature, for about ten hours or longer. After this annealing treatment, the mass is cooled to room temperature and the wafer is removed from the fused material. The wafer is then washed and lightly etched, solder dots are applied, and the wafer is heavily etched in such a way that the P-type surface layer produced in the annealing treatment is removed everywhere except under the solder dots. This etching treatment can also be applied to the wafers fabricated as in Examples 1 and 2. This etching treatment yields devices with higher ultimate rectification ratios than the treatment previously described. Wires are then attached to the solder dots and the device is given a cleaning by washing in water, etching in an acid bath and then washing in alcohol so as to remove any debris remaining from the process.

*Example 4.*—Start with an intrinsic (30 ohm-cm. at room temperature) single crystal wafer of germanium having dimensions 0.2 x 0.2 x 0.2 cm. The dimensions in this or any of the other examples are not crucial. They do not bear directly on the fundamental operation of the device. They do however, affect its quantitative behaviour, for instance, with respect to ease of adapting from one condition to another, or with respect to the ultimate frequency response. Place the wafer with a dry mixture consisting of essentially equal parts by weight of lithium hydroxide and lithium chloride, in a cylindrical container made of commercial high purity graphite. Place the container into a resistance furnace. Heat the mixture to 620° C. for three minutes in flowing dry hydrogen gas. Then, lower the temperature of the container to room temperature. Remove the wafer (now N-type, doped with lithium) from the fused mass and graphite container. Clean the wafer by washing in dilute nitric acid, water, alcohol, and a conventional germanium etch (for instance one part 48% HF to two parts concentrated $HNO_3$). Place the cleaned wafer in a new, clean graphite crucible, put the crucible with the wafer into a furnace and heat at a temperature of 520° C. for two minutes in flowing hydrogen. Cool to room temperature and remove the wafer from the furnace, and check its conductivity type, as with a thermal probe. If the wafer is N-type, return the wafer to the furnace and repeat the foregoing annealing step. Repeat the checking and annealing until the wafer is slightly P-type, or until it is essentially intrinsic. When this condition is reached, apply solder dots and lead wires and etch, as described in Example 3.

*Example 5.*—To make a one junction adaptive device, proceed as in Example 3, but apply only one dot to the P-type layer. Etch, as in that example, so that the P-type layer is removed everywhere except under the one dot. Then, apply another dot to the N-type substrate which was exposed by etching and continue as before. The contact to the N-type region will not exhibit adaptive effects.

*Example 6.*—To produce another embodiment of a one junction adaptive device, place a small heap of lithium hydroxide on a 1 ohm-cm. P-type wafer of single crystal germanium 40 mils thick. Place this wafer with the lithium hydroxide upon a clean quartz plate in a resistance furnace of low heat capacity. Heat the wafer at about 500° C. in an atmosphere of flowing dry hydrogen for about 20 seconds and then cool as rapidly as possible. Clean and etch lightly. Attach solder dots to the wafer, one in the region on which the lithium source was placed and one elsewhere on the wafer. Re-etch lightly.

In any of these examples other lithium sources may be used. Such sources should ultimately suuply lithium in the form of ions. Examples of such sources are: lithium chloride mixed with powdered calcium metal, lithium hydroxide mixed with salts other than lithium chloride, lithium hydroxide mixed with lithium chloride in other than the proportions stated in the examples, lithium suspended in a carrier oil, lithium evaporated on the surface of the semiconductor. In some of these cases and others not mentioned appropriate variations in the initial procedure of introducing the ions into the semiconductor will be required.

What is claimed is:

1. A semiconductor device comprising a body of semiconductor material including an N-type region and a P-type region, a P-N junction separating said N-type and and P-type regions, one of said N-type and P-type regions containing inclusions of the elemental form of a relatively-mobile, conductivity-type-determining impurity, and nucleation centers for producing said inclusions in and adjacent said junction.

2. A semiconductor device comprising a body of semiconductor material including an N-type region and a P-type region, a P-N junction separating said N-type and P-type regions, said N-type region containing lithium as a conductivity-type-determining impurity and also inclusions, as separate phases, of elemental lithium distributed in said region, and nucleation centers for precipitating elemential lithium in and adjacent said junction.

3. A semiconductor device comprising a body of semiconductor material including an N-type region and a P-type region, a P-N junction between said N-type and P-type regions, said N-type region containing lithium as a conductivity-type-determining impurity and also precipitates of elemental lithium distributed in said region, said P-type region containing a relatively-immobile P-type impurity, nucleation centers for precipitating elemental lithium in and adjacent said junction, and electrodes connected to each of said regions.

4. A semiconductor device comprising a body of germanium including an N-type region and a P-type region, a P-N junction separating said N-type and P-type regions, said N-type region containing lithium as a conductivity-type-determining impurity and also precipitates of elemental lithium distributed in said region, said P-type region containing a relatively-immobile P-type impurity, nucleation centers for precipitating elemental lithium in and adjacent said junction.

5. A semiconductor device comprising a body of semiconductor material including alternate regions of opposite conductivity type, a P-N junction separating each of said alternate regions from the adjacent alternate region, at least one of said alternate regions containing inclusions, as separate phases, of the elemental form of a relatively-mobile, conductivity-type-determining impurity, and nucleation centers for precipitating the elemental form of said impurity in and adjacent at least one junction defined by said one alternate region.

6. A semiconductor device comprising a body of semiconductor material including three alternate regions of opposite conductivity type, a P-N junction separating each alternate region from an adjacent alternate region, one of said alternate regions containing inclusions of the elemental form of a relatively-mobile conductivity-type-determining impurity, and nucleation centers for precipitating the elemental form of said impurity in and adjacent at least one of said junctions.

7. A semiconductor device comprising a body of semiconductor material including three alternate regions of opposite conductivity type, a P-N junction separating each of said alternate regions from an adjacent alternate region, the central one of said alternate regions containing precipitates of the elemental form of a relatively-mobile conductivity-type-determining impurity, nucleation centers for precipitating the elemental form of said impurity in and adjacent one of said junctions, and electrodes connected to each of the end alternate regions.

8. A semiconductor device comprising a body of semiconductor material including three alternate regions of opposite conductivity type, a P-N junction separating each of said alternate regions from an adjacent alternate region, the central one of said alternate regions containing inclusions, as separate phases, of the elemental form of a relatively-mobile conductivity-type-determining impurity, nucleation centers for precipitating the elemental form of said impurity in and adjacent both of the junctions, and electrodes connected to each of the end alternate regions.

9. A semiconductor device comprising a body of germanium including three alternate regions of opposite conductivity type, a P-N junction separating each of said alternate regions from an adjacent alternate region, the central one of said alternate regions containing precipitates, as separate phases, of elemental lithium, nucleation centers for precipitating elemental lithium in and adjacent both of said junctions, and electrodes connected to each of said end regions.

References Cited by the Examiner

UNITED STATES PATENTS

| | | | |
|---|---|---|---|
| 3,037,127 | 5/1962 | Logue et al. | 307—88.5 |
| 3,040,190 | 6/1962 | Buelow | 307—88.5 |
| 3,041,214 | 6/1962 | Goetzberger | 148—1.5 |
| 3,052,572 | 9/1962 | Hase | 148—1.5 |
| 3,085,225 | 4/1963 | Innes | 340—146.3 |
| 3,085,226 | 4/1963 | Brown | 340—146.3 |
| 3,095,526 | 6/1963 | Thornton | 317—235 |
| 3,108,210 | 10/1963 | Pan Kove | 317—235 |
| 3,109,147 | 10/1963 | Witt | 330—112 |
| 3,120,645 | 2/1964 | Sipress et al. | 330—112 |

JOHN W. HUCKERT, *Primary Examiner.*

S. URYNOWICZ, R. SANDLER, *Assistant Examiners.*